(12) United States Patent
Edelman et al.

(10) Patent No.: US 11,846,655 B2
(45) Date of Patent: Dec. 19, 2023

(54) SYSTEM AND METHOD FOR THREE-DIMENSIONAL (3D) UNBALANCED STEADY-STATE FREE PRECESSION MAGNETIC RESONANCE IMAGING

(71) Applicant: NORTHSHORE UNIVERSITY HEALTHSYSTEM, Evanston, IL (US)

(72) Inventors: Robert R. Edelman, Highland Park, IL (US); Ioannis Koktzoglou, Arlington Heights, IL (US)

(73) Assignee: NORTHSHORE UNIVERSITY HEALTH SYSTEM, Evanston, IL (US)

( * ) Notice: Subject to any disclaimer, the term of this patent is extended or adjusted under 35 U.S.C. 154(b) by 99 days.

(21) Appl. No.: 17/508,035

(22) Filed: Oct. 22, 2021

(65) Prior Publication Data

US 2022/0291320 A1  Sep. 15, 2022

Related U.S. Application Data

(63) Continuation-in-part of application No. 17/199,863, filed on Mar. 12, 2021.

(51) Int. Cl.
*G01R 33/561* (2006.01)
*G01R 33/567* (2006.01)
*G01R 33/56* (2006.01)

(52) U.S. Cl.
CPC ..... *G01R 33/5613* (2013.01); *G01R 33/5607* (2013.01); *G01R 33/567* (2013.01); *G01R 33/5608* (2013.01)

(58) Field of Classification Search
None
See application file for complete search history.

(56) References Cited

U.S. PATENT DOCUMENTS

| | | | |
|---|---|---|---|
| 2011/0166436 A1 | 7/2011 | Edelman | |
| 2013/0314086 A1* | 11/2013 | Li | G01R 33/5613 324/309 |
| 2014/0292325 A1* | 10/2014 | Heule | G01R 33/448 324/309 |

FOREIGN PATENT DOCUMENTS

EP        4057022 A1      9/2022

OTHER PUBLICATIONS

Edelman et al., "Twofold improved tumor-to-brain contrast using a novel T1 relaxation-enhanced steady-state (T1RESS) MRI technique," (Oct. 28, 2020), Sci. Adv. 2020; 6: eabd1635. (Year: 2020).*

(Continued)

*Primary Examiner* — Joel Lamprecht
*Assistant Examiner* — Ashish S Jasani
(74) *Attorney, Agent, or Firm* — Quarles & Brady LLP

(57) ABSTRACT

A method for generating magnetic resonance images of a subject includes performing, using a magnetic resonance imaging (MRI) system, an interrupted three-dimensional (3D) single shot unbalanced steady-state free precession (uSSFP) pulse sequence to acquire MR data for each of a plurality of partitions associated with a region of interest of a subject. The interrupted 3D single shot uSSFP pulse sequence may be configured to suppress blood signal in the region of interest. The MR data for each partition is acquired as a single shot along an in-plane phase-encoding direction and the acquisition of MR data for each partition is synchronized to a phase of a cardiac cycle. The method further includes generating, using a processor, an image with blood suppression based on the acquired MR data.

14 Claims, 8 Drawing Sheets

(56) References Cited

OTHER PUBLICATIONS

Koktzoglou et al., "Radial Fast Interrupted Steady-State (FISS) Magnetic Resonance Imaging," (Aug. 30, 2017), Magn Reson Med. Apr. 2018; 79(4): 2077-2086). (Year: 2017).*

Edelman et al., Quiescent-Interval Single-Shot Unenhanced Magnetic Resonance Angiography of Peripheral Vascular Disease: Technical Considerations and Clinical Feasibility, Magn Reson Med, 2010, 63(4):951-958.

Edelman et al., Twofold Improved Tumor-to-Brain Contrast Using a Novel T1 Relaxation-Enhanced Steady-State (T1RESS) MRI Technique, Science Advances, 2020, 6:eabd1635, pp. 1-7.

Edelman et al., T1 Relaxation-Enhanced Steady-State (T1RESS): An Improved Three-Dimensional Method for Contrast-Enhanced Imaging of Brain Tumors, Neurologic Imaging MAGNETOM Flash, 2021, 79:79-82.

Edelman et al., Breath-hold Multi-contrast 3D Dark Blood MRI of the Heart and Great Vessels with Gated Unbalanced T1 Relaxation-Enhanced Steady-State (uT1RESS), Proc Intl Soc Mag Reson Med, 2021, 2897, 3 pages.

Langham et al., Vessel-Wall Imaging and Quantification of Flow-Mediated Dilation Using Water-Selective 3D SSFP-Echo, Journal of Cardiovascular Magnetic Resonance, 2013, 15:100, pp. 1-9.

Langham et al., Rapid High-Resolution, Self-Registered, Dual Lumen-Contrast MRI Method for Vessel-Wall Assessment in Peripheral Artery Disease: A Preliminary Investigation, Acad Radiol, 2016, 23(4):457-467.

Lin et al., Blood Attenuation with SSFP-Compatible Saturation (BASS), Journal of Magnetic Resonance Imaging, 2006, 24:701-707.

Lu et al., Diffusion-Prepared Fast Imaging with Steady-State Free Precession (DP-FISP): A Rapid Diffusion MRI Technique at 7, Magn Reson Med, 2012, 68(3):868-873.

Ma et al., Magnetic Resonance Fingerprinting, Nature, 2013, 495(7440):187-192.

Miller et al., Steady-State MRI: Methods for Neuroimaging, Imaging Med, 2011, 3(1):93-105.

Reeder et al., Signal-to-Noise Ratio Behavior of Steady-State Free Precession, Magn Reson Med, 2004, 52(1):123-130.

Scheffler et al., Magnetization Preparation During the Steady State: Fat-Saturated 3D TrueFISP, Magnetic Resonance in Medicine, 2001, 45:1075-1080.

Schmalbrok et al., Three-Dimensional Steady-State MR Angiography of the Lower Extremities, J Magn Reson Imaging, 1994, 4(2):223-230.

European Patent Office, Extended Search Report, Application No. 22161565.1, dated Jul. 14, 2022, 12 pages.

European Patent Office, Extended Search Report, Application No. 22203000.9, dated Mar. 16, 2023, 10 pages.

\* cited by examiner

SYSTEM AND METHOD FOR THREE-DIMENSIONAL (3D) UNBALANCED STEADY-STATE FREE PRECESSION MAGNETIC RESONANCE IMAGING

CROSS-REFERENCE TO RELATED APPLICATIONS

This application is a continuation-in-part of co-pending U.S. patent application Ser. No. 17/199,863, filed on Mar. 12, 2021, entitled "System and Method for Magnetization-Prepared Three-Dimensional Unbalanced Steady-State Free Precession Magnetic Resonance Imaging," which is incorporated herein by reference in its entirety.

FIELD

The present disclosure relates to magnetic resonance imaging (MRI) and systems. More particularly, the present disclosure relates to systems and methods for MRI utilizing an interrupted 3D single-shot unbalanced steady-state free precession (uSSFP) acquisition to suppress blood signal and to reduce sensitivity to motion and susceptibility artifacts.

BACKGROUND

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

Steady-state gradient-echo acquisition techniques such as balanced steady-state free precession (bSSFP) are widely used in MRI because they provide a highly efficient acquisition with excellent signal-to-noise ratio. Tissue contrast in steady-state acquisitions is dependent on the ratio $T_2/T_1$ of the tissue relaxation times, where $T_2$ is the transverse relaxation time and $T_1$ is the longitudinal relaxation time. Certain tissues, specifically fluids, blood and fat, typically appear bright in steady-state images. In contrast-enhanced MRI, both the tissue $T_1$ relaxation time of an enhancing tissue and the tissue $T_2$ relaxation time are reduced by the contrast agent with the result that the ratio $T_2/T_1$, which determines tissue signal with steady-state MRI, is largely unchanged. As a result, contrast-enhanced MRI is almost always performed using fast low angle shot (FLASH) pulse sequences, even though the signal-to-noise ratio is much lower than with a steady-state pulse sequence. Balanced steady-state free precession techniques also have the property of being intrinsically compensated with respect to flow-induced phase shifts, so that flowing blood appear bright. Consequently, bSSFP techniques are routinely used to image the flow of blood in the heart (e.g., "cineangiography") and are also used as the readout for non-contrast MR angiographic techniques such as quiescent interval slice-selective (QISS) magnetic resonance angiography (MRA).

As mentioned, blood within the vasculature and cardiac chambers appears bright in contrast-enhanced MRI when a FLASH readout is used, as well as with a bSSFP readout even without contrast administration. However, there are many circumstances where it would be preferable for blood to appear dark. For example, the blood pool signal inside the left ventricle of the heart will appear bright following contrast administration using standard inversion-prepared late gadolinium enhancement scans, irrespective of whether a bSSFP or FLASH readout is used. The bright blood pool signal can mask subendocardial enhancement within the myocardium. For perfusion imaging (i.e., imaging of the microvasculature) using either dynamic contrast-enhanced (DCE) MRI or non-contrast imaging using arterial spin labeling (ASL), bright signal from large vessels can mask the signal from the microvasculature.

It would therefore be desirable to provide a system and method for acquiring MR data and generating MR images that can suppress the blood signal in large cavities (such as the chambers of the heart) and outside of the microvasculature without suppressing the blood signal from the microvasculature.

SUMMARY

In accordance with an embodiment, a method for generating magnetic resonance images of a subject, includes performing, using a magnetic resonance imaging (MRI) system, an interrupted three-dimensional (3D) single shot unbalanced steady-state free precession (uSSFP) pulse sequence to acquire MR data for each of a plurality of partitions associated with a region of interest of a subject. The interrupted 3D single shot uSSFP pulse sequence may be configured to suppress blood signal in the region of interest. The MR data for each partition is acquired as a single shot along an in-plane phase-encoding direction and the acquisition of MR data for each partition is synchronized to a phase of a cardiac cycle. The method further includes generating, using a processor, an image with blood suppression based on the acquired MR data.

In accordance with another embodiment, a magnetic resonance imaging (MRI) system includes a magnet system configured to generate a polarizing magnetic field about at least a portion of a subject, a plurality of gradient coils configured to apply at least one gradient field to the polarizing magnetic field, a radio frequency (RF) system configured to apply an excitation field to the subject and to receive MR data from the subject and a computer system. The computer system may be programmed to perform an interrupted three-dimensional (3D) single shot unbalanced steady-state free precession (uSSFP) pulse sequence to acquire MR data for each of a plurality of partitions associated with a region of interest of a subject. The interrupted 3D single shot uSSFP pulse sequence may be configured to suppress blood signal in the region of interest. The MR data for each partition is acquired as a single shot along an in-plane phase-encoding direction and the acquisition of MR data for each partition is synchronized to a phase of a cardiac cycle. The computer system is further programmed to generate an image with blood suppression based on the acquired MR data.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
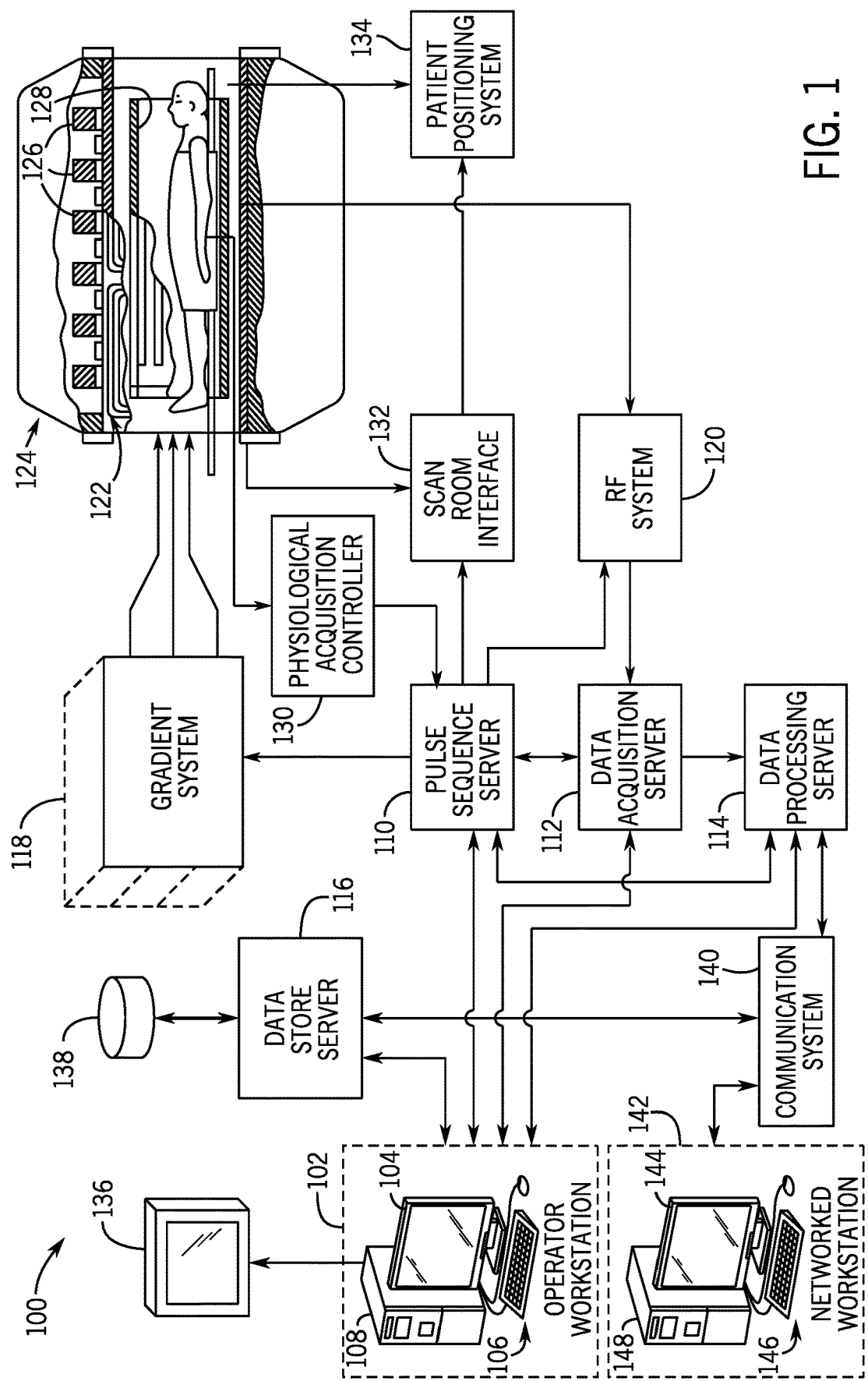
FIG. 1 is a block diagram of an example MRI system for use in accordance with an embodiment.

Referring now to FIG. 1, the disclosed systems and methods may be implemented using or designed to accompany a magnetic resonance imaging ("MRI") system 100, such as is illustrated in FIG. 1. The MM system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MM system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchange between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

The present disclosure describes a system and method for magnetization-prepared unbalanced steady-state free precession (uSSFP) MR imaging that suppresses blood signal and reduces motion sensitivity. In particular, the disclosed magnetization-prepared uSSFP technique may be used to suppress blood signal from macroscopic vessels without suppressing the blood signal from the microvasculature. The technique uses a three-dimensional (3D) uSSFP sequence (or readout) which suppresses blood signal due to intravoxel dephasing. In an embodiment, the 3D uSSFP readout may be combined with a magnetization preparation module to obtain a desired level of tissue contrast. In addition, the 3D uSSFP readout is configured to suppress the blood signal without having undue sensitivity to motion.

In some embodiments the 3D uSSFP sequence (or readout) may be implemented in an interrupted, single shot acquisition scheme. As mentioned above, a 3D uSSFP sequence (or readout) can suppress blood signal due to intravoxel dephasing. Advantageously, the interrupted 3D single-shot uSSFP acquisition can suppress blood signal and reduce sensitivity to motion and susceptibility artifacts. For example, the disclosed interrupted 3D single-shot uSSFP technique may be used to suppress blood signal from macroscopic vessels without suppressing the blood signal from the microvasculature. In some embodiments, the interrupted 3D single shot uSSFP sequence may be combined with cardiac synchronization (i.e., cardiac gating) to restrict data acquisition to a phase of the cardiac cycle. In some embodiments, the interrupted 3D single shot uSSFP sequence may also be combined with a magnetization preparation module to obtain a desired level of tissue contrast.

Figure 2:
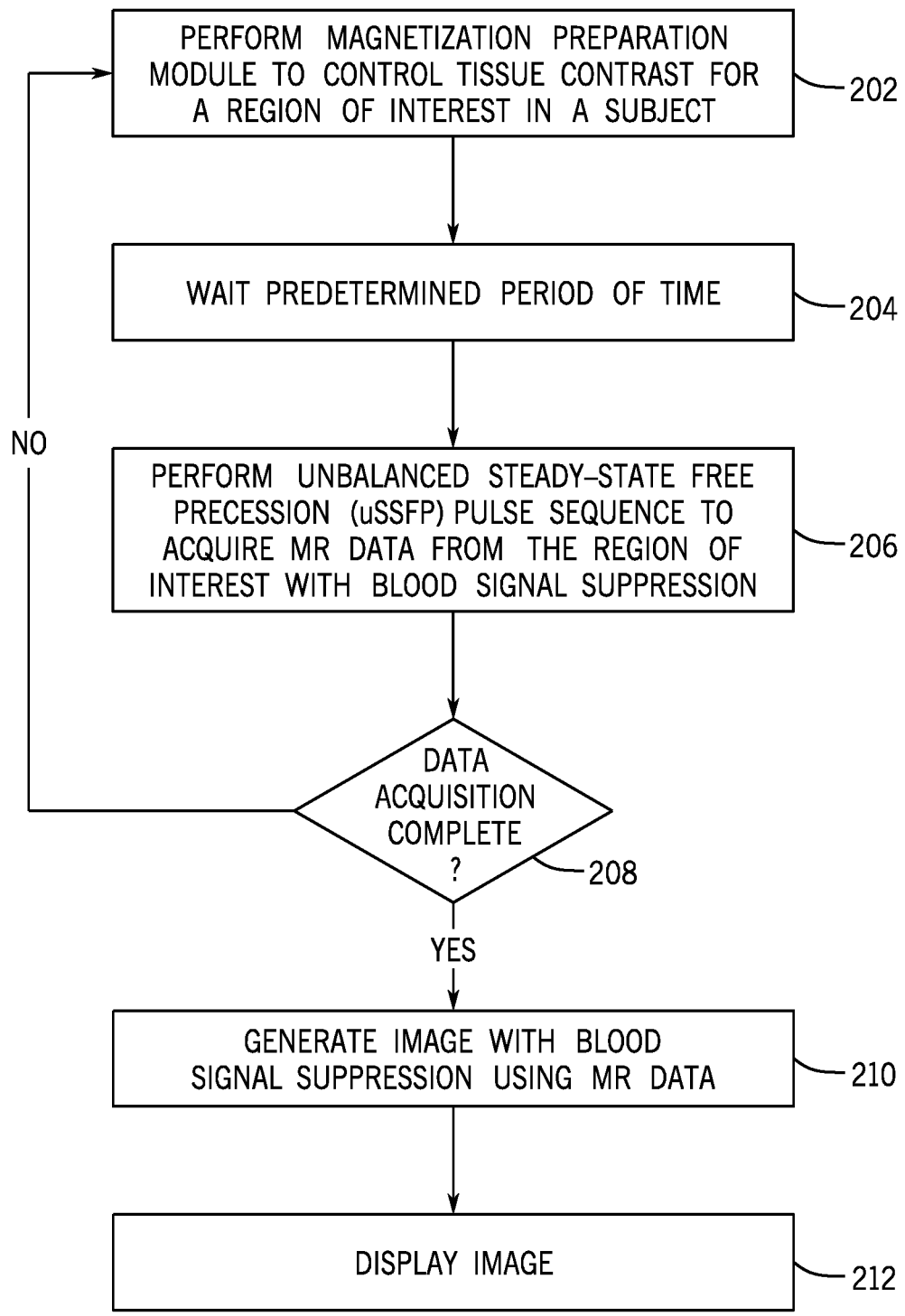
FIG. 2 illustrates a method for generating a magnetic resonance (MR) image of a subject in accordance with an embodiment.
Figure 3:
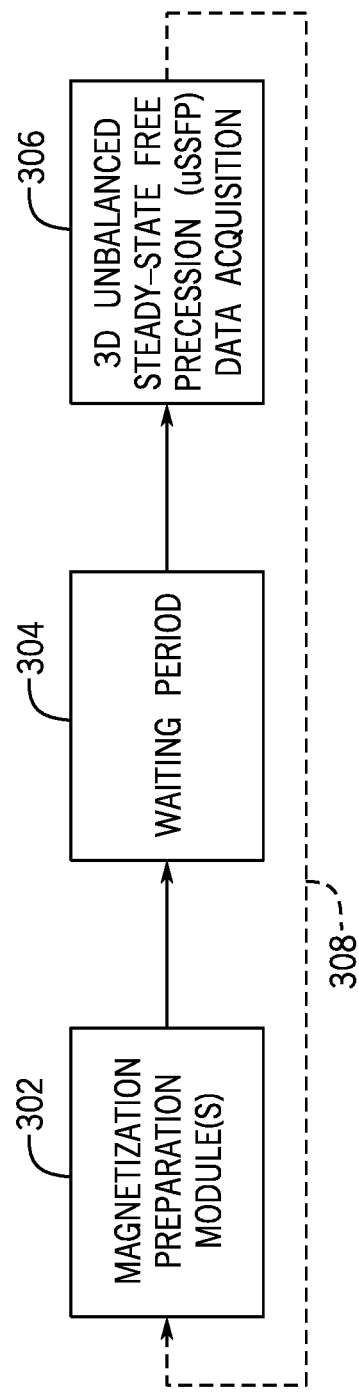
FIG. 3 is a block diagram illustrating a magnetization prepared three-dimensional (3D) unbalanced steady-state free precession (uSSFP) acquisition for obtaining MR data of a subject in accordance with an embodiment.

FIG. 2 illustrates a method for generating a magnetic resonance (MR) image of a subject in accordance with an embodiment and FIG. 3 is a block diagram illustrating a magnetization prepared unbalanced steady-state free precession (uSSFP) acquisition for obtaining MR data of a subject in accordance with an embodiment. As mentioned, the system and method described herein combines a magnetization preparation module and a 3D uSSFP readout to acquire MR data and generate MR images with blood suppression and reduced motion sensitivity. Referring to FIGS. 2 and 3, at block 202 a magnetization preparation module 302 is performed for (or applied to) a region of interest in a subject using, for example, an MRI system (e.g., MRI system 100 described above with respect to FIG. 1). The magnetization preparation module 302 is used to control tissue contrast in the region of interest in the subject, for example, to obtain a desired level of tissue contrast. The magnetization preparation module 302 may include, but is not limited to, an inversion (or inversion recovery) radiofrequency (RF) pulse, a magnetization transfer RF pulse, a saturation RF pulse, a $T_2$ preparation, pulsed spin labeling, or pseudo-continuous spin labeling. In one example, a 180° inversion pulse may be used to prepare the magnetization and form contrast in the tissue. In another example, an off-resonance magnetization transfer (MT) RF pulse may be applied to a macromolecular pool (or "bound" pool) prior to imaging. In yet another example, a saturation RF pulse (e.g., spatial saturation pulses, flow saturation pulses, spectral saturation pulses) may be used to suppress the MR signal from moving tissue outside the imaged volume. In another example, a $T_2$ preparation may be used to impart $T_2$ sensitivity. In another example, pseudo-continuous spin labeling may be used to magnetically label/tag flowing blood. In an embodiment, a saturation RF pulse, inversion RF pulse or pseudo-continuous spin labeling preparation may be applied to inflowing spins.

After the magnetization preparation module 302 has been performed at block 202, the process waits for a predetermined period of time (for example, waiting period 304 shown in FIG. 3) at block 204 before performing or playing out the 3D uSSFP readout. In an embodiment, the waiting period 204 is a lengthy waiting period, for example, greater than 100 milliseconds. After the waiting period 304, at block 206 a 3D uSSFP readout 306 is performed using, for example, an MRI system (e.g., MRI system 100 described above with respect to FIG. 1) to acquire MR data from the region of interest in the subject. In an embodiment, the 3D uSSFP readout is configured to suppress blood signal in the region of interest. For example, the 3D uSSFP readout suppresses blood signal due to intravoxel dephasing. In an embodiment, the uSSFP readout 306 is also configured to reduce motion sensitivity (e.g., minimize motion artifacts). In one example, motion artifacts may be minimized by using a very weak dephasing gradient in combination with a large number of sequence repetitions (where each repetition is the time (repetition time (TR)) between RF excitation pulses (e.g., RF excitation pulses 412 shown in FIG. 4)) to provide gradual phase dispersion that is consistently applied in every sequence repetition. In one embodiment, a "weak" dephasing gradient refers to fractional additional gradient dephasing (ranging from 0 to $\pi$ radians) after the application of the frequency encoding gradient and the number of sequence repetitions may be twenty or more repetitions. In an embodiment, an RF flip angle of a least 90 degrees may be used in the 3D uSSFP readout to obtain $T_1$ weighting. In one embodiment, the phase of successively applied RF excitation pulses is incremented by less than $\pi/6$ radians. In another embodiment, gradient spoiling (e.g., as illustrated by gradient pulse 430 shown in FIG. 4) may be applied in the 3D uSSFP readout in the frequency-encoding, slice encoding, or phase-encoding directions that produces at least $\pi$ radians of phase dispersion within each voxel before the next RF pulse repetition, inclusive of the phase dispersion imparted by the frequency-encoding gradient (e.g., frequency encoding gradient (or readout gradient lobe) 428 shown in FIG. 4) applied during data sampling. In another embodiment, a non-Cartesian k-space trajectory may be used for data acquisition and sampling. An example uSSFP pulse sequence or readout 306 is described further below with respect to FIG. 4.

At block 208, it is determined if the MR data acquisition is complete. If the MR data acquisition is not complete at block 208, the process returns to block 202 and the combination of the magnetization preparation module 302 (block 202), waiting period 304 (block 204) and 3D uSSFP sequence (block 206) are repeated (shown by arrow 308 in FIG. 3). The magnetization preparation 302, waiting period 304 and 3D uSSFP readout 306 are repeated until all the necessary MR data is acquired. If the data acquisition is complete at block 208, an image is generated at block 210 using the acquired MR data from block 206. The generated image includes blood signal suppression. In addition, as mentioned above, the generated image has minimized motion artifacts. The image may be generated using known reconstruction techniques. In an embodiment, image subtraction may be performed, for example, as part of a reconstruction process or after reconstruction as part of postprocessing. At block 212, the image may be displayed to a user on a display (e.g., display 104, 136 or 144 shown in FIG. 1). The image may also be stored in memory or data storage of, for example, an MRI system (e.g., the MRI system 100 shown in FIG. 1) or other computer system.

The magnetization-prepared 3D uSSFP technique described with respect to FIGS. 2 and 3 can also be combined with other imaging techniques. In an embodiment, the magnetization-prepared 3D uSSFP technique may be accelerated using radial under-sampling, compressed sensing, parallel imaging or simultaneous multi-slice. In another embodiment, the magnetization prepared 3D uSSFP technique may also be combined with motion reduction techniques such as navigator gating or motion correction. In yet another embodiment, the magnetization prepared 3D uSSFP technique may be performed before, during, or after the administration (e.g., injection) of a contrast agent (e.g., a paramagnetic contras agent such as gadolinium). Accordingly, the magnetization prepared 3D uSSFP technique may be used in dynamic contrast enhanced (DCE) or arterial spin labeling imaging (ASL). In another embodiment, the 3D uSSFP readout may occur within a portion of a cardiac cycle of the subject. In one example, the magnetization preparation module 302 and the 3D uSSFP readout 306 may be synchronized to a cardiac cycle of the subject using known methods. In another embodiment, two or more echoes may be acquired to permit the use of a Dixon reconstruction technique to create water-only and fat-only images. In an embodiment, electrocardiogram (ECG) or pulse gating may be used with the magnetization prepared 3D uSSFP technique.

In an embodiment, the use of a magnetization preparation module 302 in combination with the 3D uSSFP readout 306 provides a high degree of versatility in manipulating tissue contrast in order to improve the conspicuity of pathology. In one example for imaging of late gadolinium enhancement in the heart, an inversion preparation may be used in conjunction with a suitable inversion time to make enhancing infarct appear bright and normal myocardium appear dark, while the adjacent blood pool appears dark because of the 3D uSSFP readout. The result is improved contrast between subendocardial infarct and blood pool. In another example for dynamic contrast enhanced (DCE) imaging or arterial spin labeled (ASL) imaging of tissue perfusion, the 3D uSSFP readout suppresses blood signal from macroscopic vessels, therefore ensuring that perfusion measurements will only reflect the relevant microvascular flow. In yet another example for imaging of arterial wall enhancement after gadolinium injection using inversion or saturation radiofrequency (RF) preparations, the use of a 3D uSSFP readout causes the blood to appear dark. The dark blood in the vessel lumen provides strong contrast with enhancing lesions in the vessel wall due to pathology such as vasculitis or atherosclerosis.

Figure 4:
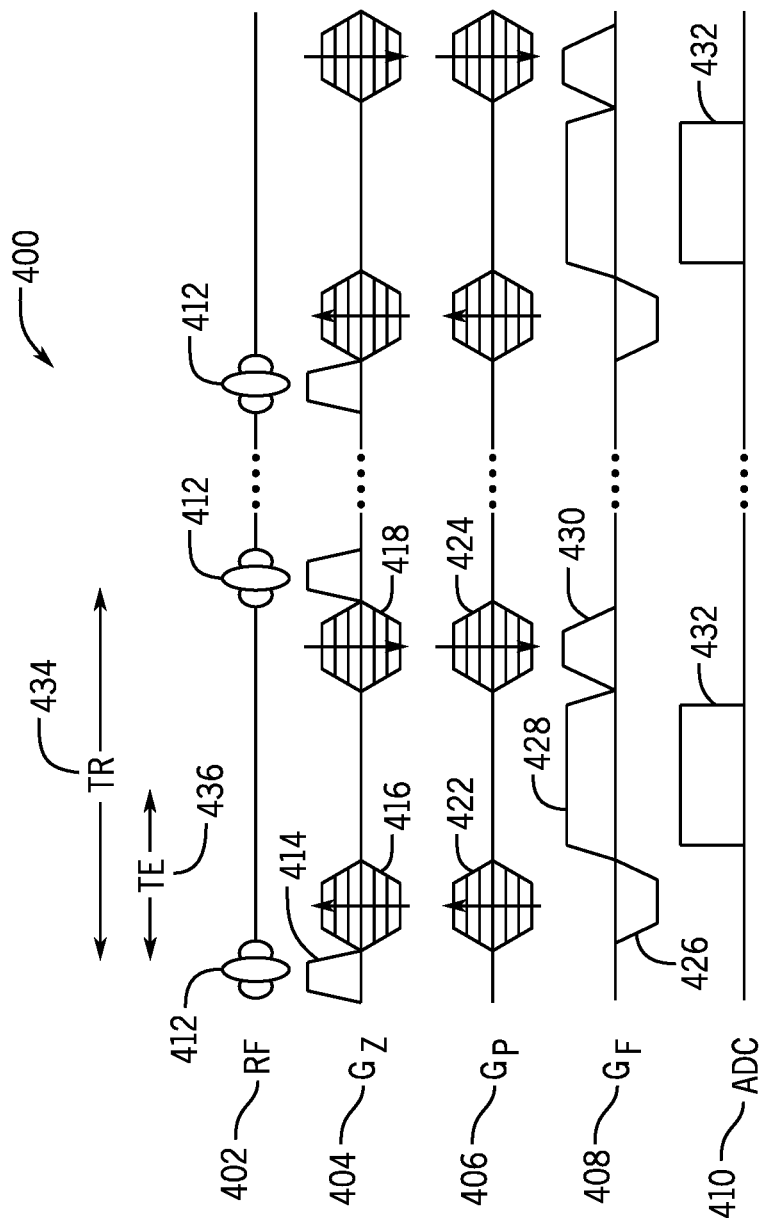
FIG. 4 is a pictorial representation of an example three-dimensional (3D) unbalanced steady-state free precession (uSSFP) pulse sequence in accordance with an embodiment.

FIG. 4 is a pictorial representation of an example three dimensional (3D) unbalanced 3D steady-state free precession (uSSFP) pulse sequence in accordance with an embodiment. As mentioned above, the 3D uSSFP pulse sequence or readout 400 may be performed (or played out) to acquire MR data using an MRI system, for example, MRI system 100 described above with respect to FIG. 1. Each repetition (defined by a repetition time (TR) 434) of the 3D uSSFP sequence 400 shown in FIG. 4 begins with, for example, a non-selective or slab selective RF excitation pulse 412 (shown on an RF axis 402) that, when slab selective, is applied in the presence of a slice selection gradient pulse 414 (shown on slice encoding axis $G_Z$ 404). A slice encoding gradient 416 and a phase encoding gradient pulse 422 (shown in phase encoding axis $G_p$ 406) are then applied to the resulting transverse magnetization and then an MR signal 432 is acquired in the presence of a readout gradient lobe (or frequency encoding gradient) 428 (shown on readout axis $G_F$ 408). A readout gradient dephasing lobe 426 (shown on readout axis $G_F$ 408) is played out prior to the readout gradient lobe 428 to produce the MR gradient echo signal 432 at an echo time (TE) 436 (shown on the data sampling analog-to-digital conversion (ADC) axis 410) during the signal readout. The phase encoding is then rewound with a phase encoding rewinder gradient pulse 424 (shown in phase encoding axis $G_p$ 406). In an embodiment, the pulse sequence 400 may be repeated many times during a scan and the slice encoding gradient pulse 416 and the phase encoding gradient pulse 422 are sequenced through a series of values to sample k-space in the prescribed manner. A slice encoding rewinder gradient pulse 418 and the phase encoding rewinder gradient pulse 424 are sequenced through the same values but opposite in polarity to rephase spins. In the uSSFP sequence 400, a readout gradient (or dephasing gradient) 430 dephases the signals from moving spins as the uSSFP sequence 400 is played out. As a result, the MR signals 432 from moving spins are suppressed and appear black. As mentioned above, in an embodiment motion artifacts may be minimized by using a very weak dephasing gradient 430 in combination with a large number of sequence repetitions to provide gradual phase dispersion that is consistently applied in every sequence repetition In an embodiment when a slab-selective excitation is used, where the slice-selective gradient pulse 414 is non-zero, the slice encoding gradient pulse 416 and the slice encoding rewinder gradient pulse 418 both include the slice encoding rewinder gradient area (not shown) which is approximately equal to half the area under the slice-selective gradient pulse 414 but is of opposite polarity.

Figure 5:
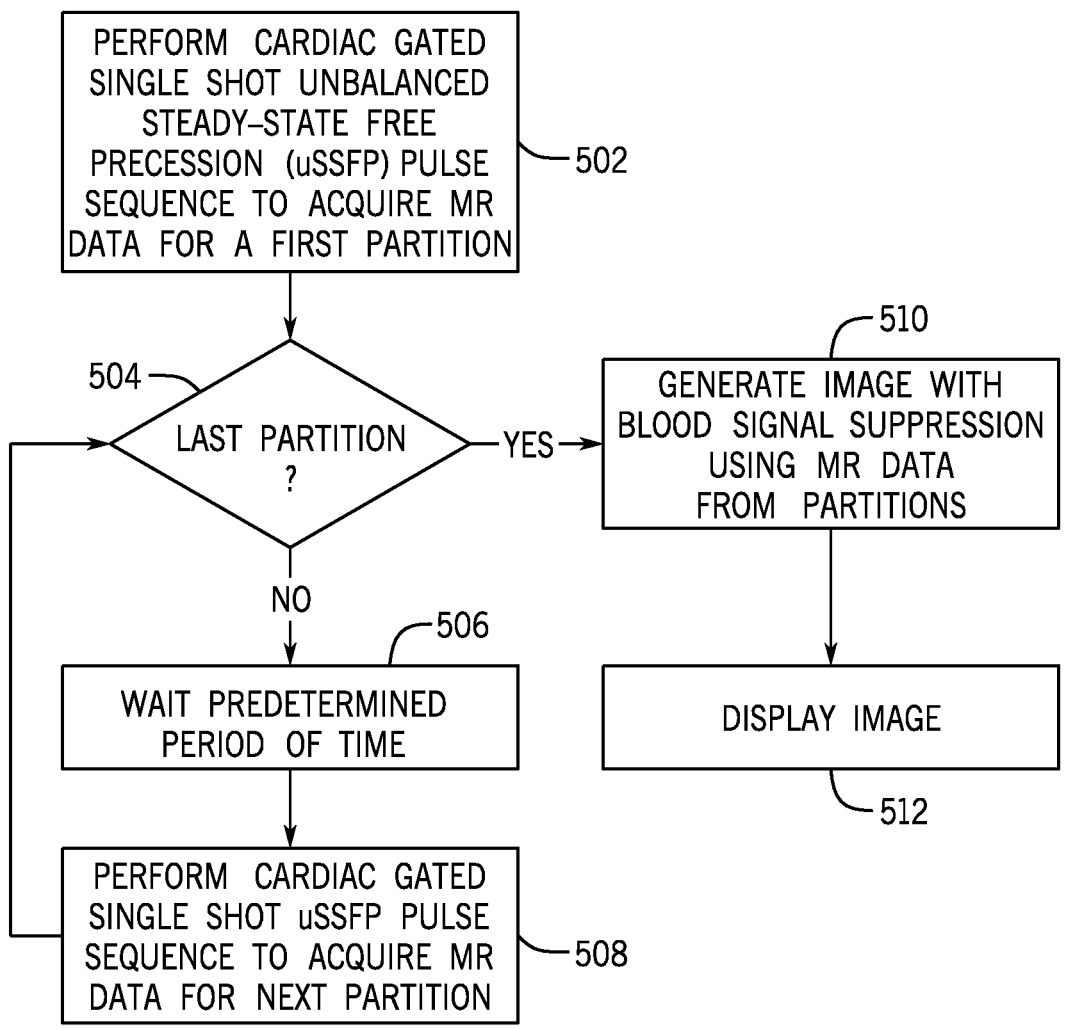
FIG. 5 illustrates a method for generating a magnetic resonance (MR) image of a subject in accordance with an embodiment.
Figure 6:
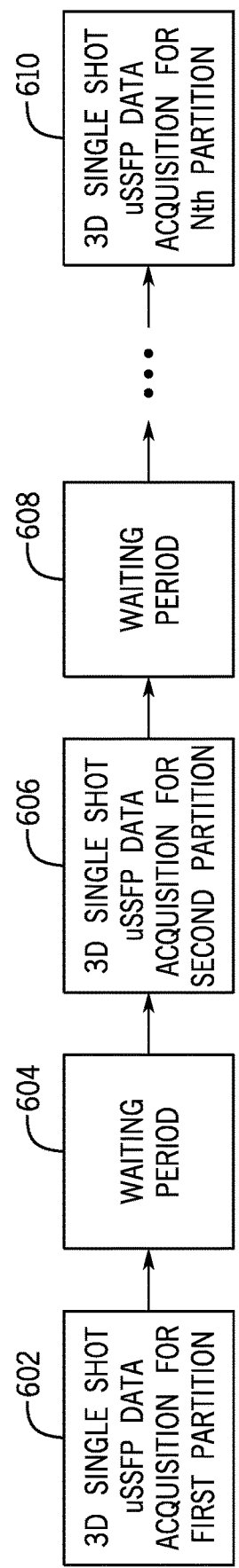
FIG. 6 is a block diagram illustrating an interrupted three-dimensional (3D) single shot unbalanced steady-state free precession (uSSFP) acquisition for obtaining MR data of a subject in accordance with an embodiment.

As mentioned above, in some embodiments the 3D uSSFP pulse sequence or readout 400 may also be implemented in an interrupted single shot acquisition scheme. FIG. 5 illustrates a method for generating a magnetic resonance (MR) image of a subject in accordance with an embodiment and FIG. 6 is a block diagram illustrating an interrupted three-dimensional (3D) single shot unbalanced steady-state free precession (uSSFP) acquisition for obtaining MR data of a subject in accordance with an embodiment. As mentioned, an interrupted 3D single shot uSSFP readout may be used to acquire MR data and generate MR images with blood suppression and reduced sensitivity to motion and susceptibility artifacts. Referring to FIGS. 5 and 6, at block 502 a 3D uSSFP readout 602 is performed using, for example, an MRI system (e.g., MRI system 100 described above with respect to FIG. 1) to acquire MR data from the region of interest in the subject. In some embodiments, the 3D uSSFP readout 602 may be performed at block 502 in a single shot for a first partition of the 3D acquisition. For example, MR data may be acquired in a single shot along an in-plane phase-encoding direction. In some embodiments, the interrupted 3D single shot 3D uSSFP sequence may utilize cardiac gating to synchronize the MR data acquisition (e.g., an acquisition of a center of k-space) along the in-plane phase-encoding direction to a portion (or phase) of a cardiac cycle (e.g., the diastolic phase). In some embodiments, the cardiac gating is electrocardiographic (ECG) gating. Advantageously, the use of cardiac gating, for example, ECG gating, minimizes signal dephasing from bulk motion, avoids vessel wall displacement during, for example, a systolic pulse wave as well as ghost artifacts from accelerating intraluminal spins, and promotes consistent signal across 3D uSSFP partitions.

In an embodiment, the 3D uSSFP readout is configured to suppress blood signal in the region of interest. For example, the 3D uSSFP readout suppresses blood signal due to intravoxel dephasing. In an embodiment, the uSSFP readout 602 is also configured to reduce motion sensitivity (e.g., minimize motion artifacts). In one example, a weak gradient spoiler may be applied within each repetition time (TR) interval so as to produce a gradual phase dispersion with <2π radians of flow-related intravoxel dephasing for one repetition time (TR), and to produce >2π radians of accumulated flow-related intravoxel dephasing at the center of k-space after multiple sequence repetitions. In an embodiment, to further reduce motion sensitivity, a moment of the dephasing gradient may be set to a fraction, for example, one-fifth, of the moment of the readout gradient. In an embodiment, an RF flip angle of between 10 degrees and 80 degrees may be used in the 3D uSSFP readout 602. In some embodiments, the sequence repetition time (TR) between successive RF excitations may be kept to a value less than 6 milliseconds with an echo time (TE) of less than 3 milliseconds in order to suppress off-resonance effects and minimize scan time. In some embodiments, the MR data may be acquired using a short echo time of 2.5 milliseconds or less than 2.5 milliseconds which minimizes sensitivity to magnetic susceptibility artifacts and also allows the use of a short repetition time (TR) in order to decrease scan time. In some embodiments, the acquisition of MR data using the 3D single shot uSSFP sequence may be performed with or without a breath-hold.

After the 3D single shot uSSFP sequence (or readout) 602 to acquire data in the first partition is complete, at block 504, it is determined if there are any additional 3D partitions to be acquired. If there are additional 3D partitions at block 504, the process proceeds to block 506 and the process waits for a predetermined period of time (for example, waiting period 604 shown in FIG. 6) before preforming or playing out a 3D single shot uSSFP readout (e.g., 3D single shot uSSFP data acquisition 606 shown in FIG. 6) for the next 3D partition at block 508. The waiting period (e.g., waiting period 604) may be configured to eliminate residual steady-state magnetization along with stimulated echoes that would otherwise contribute to motion and image artifacts. In some embodiments, the waiting period (e.g., waiting period 604) may include the application of dummy sequence repetitions to drive the magnetization towards a steady state. In some embodiments, the waiting period (e.g., waiting period 604) may include a series of constant flip angle dummy RF repetitions to drive both inflowing and in-slab spins into the steady-state. A 3D single shot uSSFP data acquisition (or readout) may be performed for each of a predetermined number (N) of 3D partitions (e.g., 3D single shot uSSFP data acquisition 610 shown in FIG. 6) with a waiting period (e.g., waiting periods 604, 608, etc. in FIG. 6) between the acquisition of MR data for each of the 3D partitions. Accordingly, the process can repeat the waiting period at block 506 and MR data acquisition at block 508 until MR data has been acquired for all of the predetermined number (N) of 3D partitions. If there are no additional 3D partitions to be acquired at block 504, an image is generated at block 510 using the acquired MR data from blocks 502-508. The generated image can include blood signal suppression. In addition, as mentioned above, the generated image can have reduced sensitivity to motion and susceptibility artifacts. The image may be generated using known reconstruction techniques. At block 512, the image may be displayed to a user on a display (e.g., display 104, 136 or 144 shown in FIG. 1). The image may also be stored in memory or data storage of, for example, an MRI system (e.g., the MRI system 100 shown in FIG. 1) or other computer system.

Figure 7:
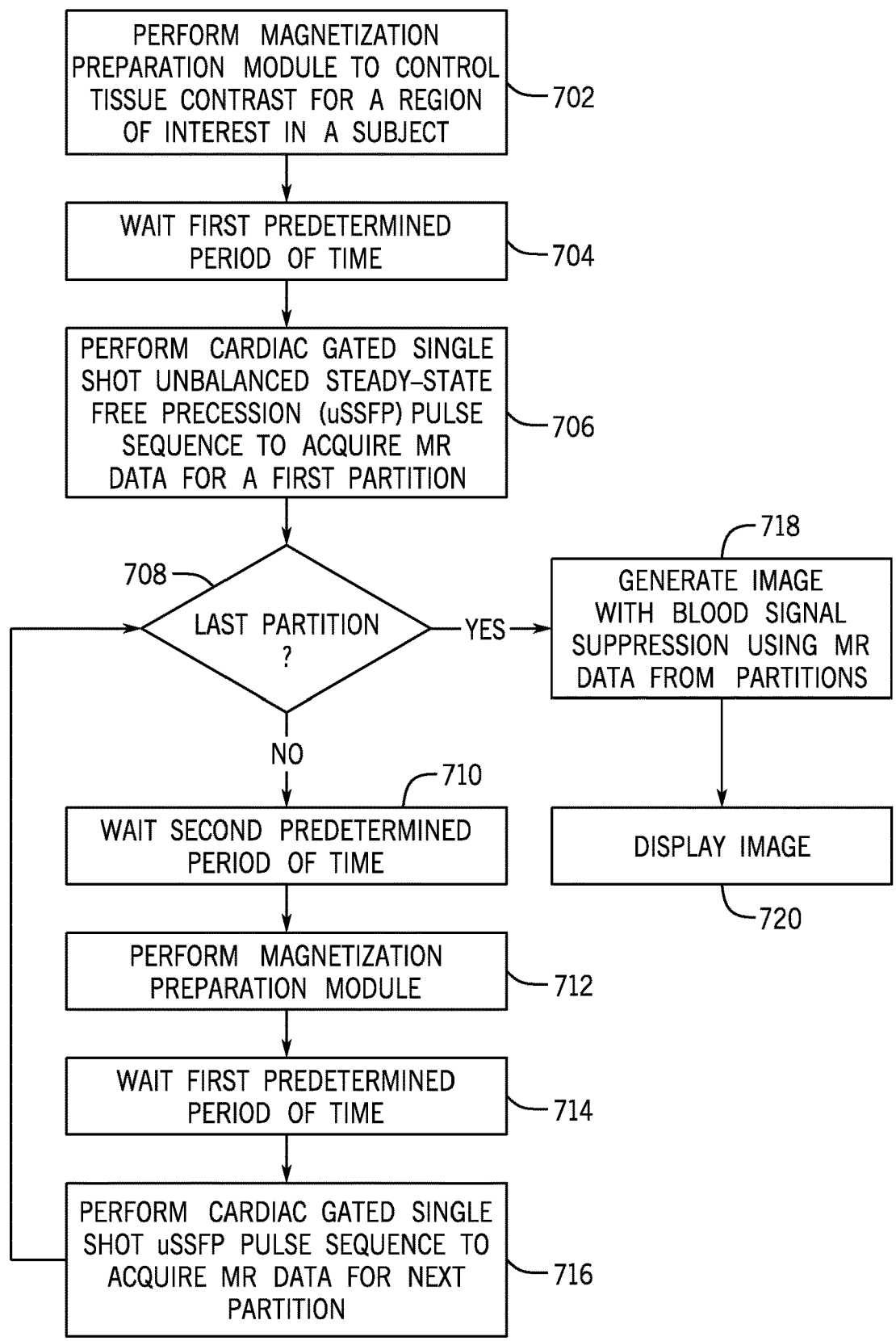
FIG. 7 illustrates a method for generating a magnetic resonance (MR) image in accordance with an embodiment.
Figure 8:
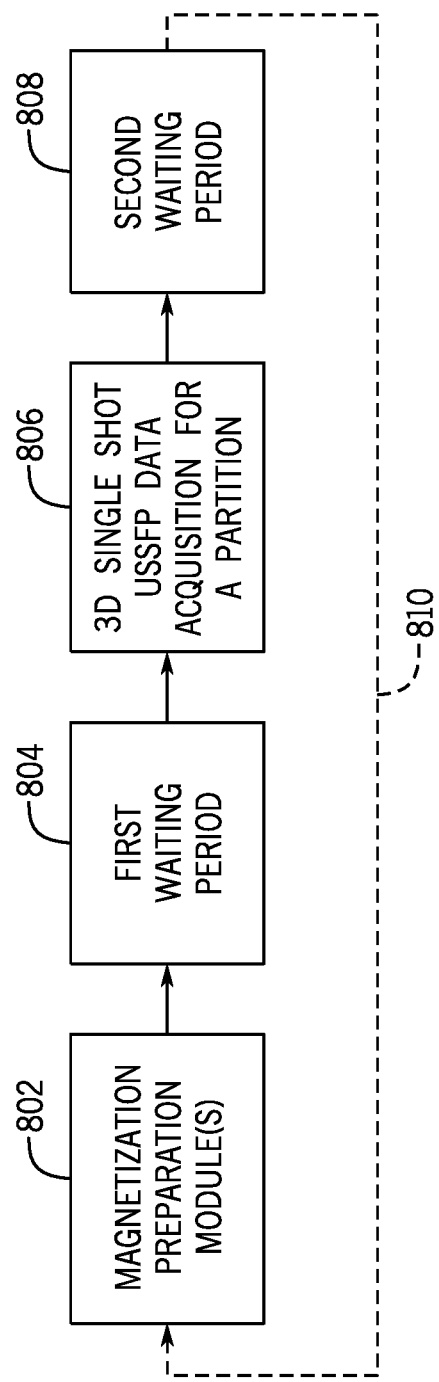
FIG. 8 is a block diagram illustrating a magnetization prepared interrupted three- dimensional (3D) single shot unbalanced steady-state free precession (uSSFP) acquisition for obtaining MR data of a subject in accordance with an embodiment.

As mentioned above, an interrupted 3D single shot uSSFP sequence may also be combined with a magnetization preparation module to obtain a desired level of tissue contrast. FIG. 7 illustrates a method for generating a magnetic resonance (MR) image in accordance with an embodiment and FIG. 8 is a block diagram illustrating a magnetization prepared interrupted three-dimensional (3D) single shot unbalanced steady-state free precession (uSSFP) acquisition for obtaining MR data of a subject in accordance with an embodiment. Referring to FIGS. 7 and 8, a magnetization preparation module 802 and a first predetermined waiting period 804 (i.e., the process waits a predetermined period of time) may be performed at blocks 702 and 704. As discussed above, the magnetization preparation module 802 may be performed for (or applied to) a region of interest in a subject using, for example, an MRI system (e.g., MRI system 100 described above with respect to FIG. 1). The magnetization preparation module 802 is used to control tissue contrast in the region of interest in the subject, for example, to obtain a desired level of tissue contrast. The magnetization preparation module 802 may include, but is not limited to, an inversion (or inversion recovery) radiofrequency (RF) pulse, a magnetization transfer RF pulse, a saturation RF pulse, a $T_2$ preparation, pulsed spin labeling, or pseudo-continuous spin labeling. In one example, a 180° inversion pulse may be used to prepare the magnetization and form contrast in the tissue. In another example, an off-resonance magnetization transfer (MT) RF pulse may be applied to a macromolecular pool (or "bound" pool) prior to imaging. In yet another example, a saturation RF pulse (e.g., spatial saturation pulses, flow saturation pulses, spectral saturation pulses) may be used to suppress the MR signal from moving tissue outside the imaged volume. In another example, a $T_2$ preparation may be used to impart $T_2$ sensitivity. In another example, pseudo-continuous spin labeling may be used to magnetically label/tag flowing blood. In an embodiment, a saturation RF pulse, inversion RF pulse or pseudo-continuous spin labeling preparation may be applied to inflowing spins. In some embodiments, after applying a magnetization preparation module 802, at block 704 the process waits for a first predetermined period of time 804 after the magnetization preparation module 802 has been performed at block 702 before performing or playing out the interrupted 3D single shot uSSFP readout. In an embodiment, the first waiting period 804 is a lengthy waiting period, for example, greater than 100 milliseconds.

At block 706, a 3D uSSFP readout 806 is performed using, for example, an MRI system (e.g., MRI system 100 described above with respect to FIG. 1) to acquire MR data from the region of interest in the subject. In some embodiments, the 3D uSSFP readout 806 may be performed at block 706 in a single shot for a first partition of the 3D acquisition. For example, MR data may be acquired in a single shot along an in-plane phase-encoding direction. In some embodiments, the interrupted 3D single shot 3D uSSFP sequence may utilize cardiac gating to synchronize the MR data acquisition (e.g., an acquisition of a center of k-space) along the in-plane phase-encoding direction to a portion (or phase) of a cardiac cycle (e.g., the diastolic phase). In some embodiments, the cardiac gating is electrocardiographic (ECG) gating. Advantageously, the use of cardiac gating, for example, ECG gating, minimizes signal dephasing from bulk motion, avoids vessel wall displacement during, for example, a systolic pulse wave as well as ghost artifacts from accelerating intraluminal spins, and promotes consistent signal across 3D uSSFP partitions.

As discussed above, in some embodiments, the 3D uSSFP readout is configured to suppress blood signal in the region of interest. For example, the 3D uSSFP readout suppresses blood signal due to intravoxel dephasing. In an embodiment, the uSSFP readout 806 is also configured to reduce motion sensitivity (e.g., minimize motion artifacts). In one example, a weak gradient spoiler may be applied within each repetition time (TR) interval so as to produce a gradual phase dispersion with <$2\pi$ radians of flow-related intravoxel dephasing for one repetition time (TR), and to produce >$2\pi$ radians of accumulated flow-related intravoxel dephasing at the center of k-space after multiple sequence repetitions. In an embodiment, to further reduce motion sensitivity, a moment of the dephasing gradient may be set to a fraction, for example, one-fifth, of the moment of the readout gradient. In an embodiment, an RF flip angle of between 10 degrees and 80 degrees may be used in the 3D uSSFP readout 806. In some embodiments, the sequence repetition time (TR) between successive RF excitations may be kept to a value less than 6 milliseconds with an echo time (TE) of less than 3 milliseconds in order to suppress off-resonance effects and minimize scan time. In some embodiments, the MR data may be acquired using a short echo time of 2.5 milliseconds or less than 2.5 milliseconds which minimizes sensitivity to magnetic susceptibility artifacts and also allows the use of a short repetition time (TR) in order to decrease scan time. In some embodiments, the acquisition of MR data using the 3D single shot uSSFP sequence may be performed with or without a breath-hold.

After the 3D single shot uSSFP sequence (or readout) 806 to acquire data in the first partition is complete, at block 708, it is determined if there are any additional 3D partitions to be acquired. If there are additional 3D partitions at block 708, the process proceeds to block 710 and the process waits for a second predetermined period of time (for example, waiting period 808 shown in FIG. 8) before performing the combination of the magnetization preparation module 802 (block 712) and first waiting period 804 (block 714) as shown by arrow 810 in FIG. 8. At block 716, a 3D single shot uSSFP readout (e.g., 3D single shot uSSFP data acquisition 806 shown in FIG. 8) for the next 3D partition is performed or played out. The second waiting period (e.g., second waiting period 808) may be configured to eliminate residual steady-state magnetization along with stimulated echoes that would otherwise contribute to motion and image artifacts. In some embodiments, the second waiting period (e.g., waiting period 708) may include the application of dummy sequence repetitions to drive the magnetization towards a steady state. In some embodiments, the second waiting period (e.g., second waiting period 708) may include a series of constant flip angle dummy RF repetitions to drive both inflowing and in-slab spins into the steady-state. A 3D single shot uSSFP data acquisition (or readout) may be performed for each of a predetermined number (N) of 3D partitions (e.g., 3D single shot uSSFP data acquisition 806 shown in FIG. 8) with a second waiting period (e.g., second waiting period 808, etc. in FIG. 8), and the combination of the magnetization preparation module 801 (block 712) and the first waiting period 804 (block 714) performed between the acquisition of MR data for each of the 3D partitions. Accordingly, the process can repeat the second waiting period at block 714, the magnetization preparation module 802 at block 714, the first waiting period 802 at block 714, and the MR data acquisition at block 716 until MR data has been acquired for all of the predetermined number (N) of 3D partitions. If there are no additional 3D partitions to be acquired at block 708, an image is generated at block 718 using the acquired MR data from blocks 706-716. The generated image can include blood signal suppression. In addition, as mentioned above, the generated image can have reduced sensitivity to motion and susceptibility artifacts. The image may be generated using known reconstruction techniques. At block 720, the image may be displayed to a user on a display (e.g., display 104, 136 or 144 shown in FIG. 1). The image may also be stored in memory or data storage of, for example, an MRI system (e.g., the MRI system 100 shown in FIG. 1) or other computer system.

The interrupted 3D single shot uSSFP technique described with respect to FIGS. 5, 6 7, and 8 can also be combined with other imaging techniques. In an embodiment, the interrupted 3D single shot uSSFP technique may be accelerated using radial under-sampling, compressed sensing, parallel imaging or simultaneous multi-slice. In some embodiments, two or more partition-encoding steps may be acquired in each imaging shot. In another embodiment, the interrupted 3D single shot uSSFP technique may also be combined with motion reduction techniques such as navigator gating or motion correction.

In some embodiments, the disclosed interrupted 3D single shot uSSFP sequence may be used to acquire a cine series spanning multiple phases of a cardiac cycle. In some embodiments, the interrupted 3D single shot uSSFP sequence may be configured to acquire more than one echo. In some embodiments, the interrupted 3D single shot uSSFP sequence may include the application of regionally selective RF pulses outside of the 3D imaging slab.

The disclosed interrupted 3D single shot uSSFP sequence may be used, for example, for dark blood imaging of the chest including applications of lung, cardiac and vascular imaging. For example, the interrupted 3D single shot uSSFP sequence may be used for dark blood imaging of the heart, great vessels and the lungs. In some embodiments, the interrupted 3D single shot uSSFP sequence may be used for dark blood imaging of the lungs to detect cancerous lesions, or for dark blood unbalanced imaging of atherosclerotic plaque. In some embodiments, the interrupted 3D single shot uSSFP sequence may be used for imaging of any region of a subject containing air-soft or bone-soft tissue interfaces and may be used for imaging near meatal implants in a subject. MR data acquired using the interrupted 3D single shot uSSFP sequence may be used in various clinical applications, for example, to measure aortic plaque volumes, to detect and characterize mural plaque and thrombus in the carotid arteries and intracranial circulation, or to detect arterial wall inflammation in vasculitis or vulnerable plaque.

Computer-executable instructions for an interrupted uSSFP technique according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for generating magnetic resonance images of a subject, the method comprising:
performing, using a magnetic resonance imaging (MRI) system, a three-dimensional (3D) unbalanced steady-state free precession (uSSFP) readout to acquire MR data for each of a plurality of partitions associated with a region of interest of a subject, the 3D uSSFP readout comprising applying a gradient spoiler at a time after the application of an RF excitation pulse within each repetition time (TR) interval to produce a gradual phase dispersion with <2π radians of flow-related intravoxel dephasing for one repetition time (TR) interval, and to produce >2π radians of accumulated flow-related intravoxel dephasing at the center of k-space after multiple repetition time (TR) intervals, the 3D uSSFP readout configured to suppress blood signal in the region of interest, wherein the MR data for each partition is acquired as a single shot along an in-plane phase-encoding direction and the acquisition of MR data for each partition is synchronized to a phase of a cardiac cycle;
performing a predetermined waiting period between the acquisition of MR data for each of the plurality of partitions; and
generating, using a processor, an image with blood suppression based on the acquired MR data.

2. The method according to claim 1, further comprising performing, using the MRI system, a magnetization preparation module before performing the 3D uSSFP readout for each of the plurality of partitions, the magnetization preparation configured to control tissue contrast for the region of interest in the subject.

3. The method according to claim 1, further comprising displaying the generated image on a display.

4. The method according to claim 1, wherein an echo time (TE) of the 3D uSSFP readout is less than 2.5 milliseconds.

5. The method according to claim 1, wherein the acquisition of MR data from a center of k-space along the phase-encoding direction for each partition is synchronized to the phase of the cardiac cycle.

6. The method according to claim 5, wherein the phase of the cardiac cycle is a diastolic phase.

7. The method according to claim 1, wherein the 3D uSSFP readout is accelerated using one or more of compressed sensing, parallel imaging, or simultaneous multi-slice.

8. A magnetic resonance imaging (MRI) system comprising:
a magnet system configured to generate a polarizing magnetic field about at least a portion of a subject;
a plurality of gradient coils configured to apply at least one gradient field to the polarizing magnetic field;

a radio frequency (RF) system configured to apply an excitation field to the subject and to receive MR data from the subject; and a computer system programmed to:

perform a three-dimensional (3D) unbalanced steady-state free precession (uSSFP) readout to acquire MR data for each of a plurality of partitions associated with a region of interest of a subject, the 3D uSSFP readout comprising applying a gradient spoiler at a time after the application of an RF excitation pulse within each repetition time (TR) interval to produce a gradual phase dispersion with <2π radians of flow-related intravoxel dephasing for one repetition time (TR) interval, and to produce >2π radians of accumulated flow-related intravoxel dephasing at the center of k-space after multiple repetition time (TR) intervals, the 3D uSSFP readout configured to suppress blood signal in the region of interest, wherein the MR data for each partition is acquired as a single shot along an in-plane phase-encoding direction and the acquisition of MR data for each partition is synchronized to a phase of a cardiac cycle;

perform a predetermined waiting period between the acquisition of MR data for each of the plurality of partitions; and generate an image with blood suppression based on the acquired MR data.

9. The system according to claim 8, further comprising a display coupled to the computer system and wherein the computer system is further programmed to display the generated image on the display.

10. The system according to claim 8, wherein the computer system is further programmed to perform a magnetization preparation module before performing the 3D uSSFP readout for each of the plurality of partitions, the magnetization preparation configured to control tissue contrast for the region of interest in the subject.

11. The system according to claim 8, wherein an echo time (TE) of the 3D uSSFP readout is less than 2.5 milliseconds.

12. The system according to claim 8, wherein the acquisition of MR data from a center of k-space along the phase-encoding direction for each partition is synchronized to the phase of the cardiac cycle.

13. The system according to claim 12, wherein the phase of the cardiac cycle is a diastolic phase.

14. The system according to claim 8, wherein the 3D uSSFP readout is accelerated using one or more of compressed sensing, parallel imaging, or simultaneous multi-slice.

* * * * *